United States Patent [19]

Nishioka et al.

[11] Patent Number: 4,845,008

[45] Date of Patent: Jul. 4, 1989

[54] LIGHT-SENSITIVE POSITIVE WORKING, O-GUINONE DIAZIDE PRESENSITIZED PLATE WITH MIXED SOLVENT

[75] Inventors: Akira Nishioka; Toshimi Hirano; Keiji Akiyama, all of Shizuoka, Japan

[73] Assignee: Fuji Photo Film Co., Ltd., Ashigara, Japan

[21] Appl. No.: 13,533

[22] Filed: Feb. 11, 1987

[30] Foreign Application Priority Data

Feb. 20, 1986 [JP] Japan .................. 61-36417
Apr. 24, 1986 [JP] Japan .................. 61-95463

[51] Int. Cl.$^4$ .................. G03C 1/94; G03C 1/60; G03F 7/08
[52] U.S. Cl. .................. 430/165; 430/191; 430/192; 430/193; 430/302; 430/166
[58] Field of Search .............. 430/191, 192, 165, 193, 430/302, 166

[56] References Cited

U.S. PATENT DOCUMENTS

| | | | |
|---|---|---|---|
| 4,350,753 | 9/1982 | Shelnut et al. | 430/191 |
| 4,395,527 | 7/1987 | Berger | 430/190 |
| 4,487,823 | 12/1984 | Lehmann et al. | 430/191 |
| 4,550,069 | 10/1985 | Pampalone | 430/191 |
| 4,626,491 | 12/1986 | Gray | 430/191 |
| 4,626,492 | 12/1986 | Eilbeck | 430/191 |
| 4,659,642 | 4/1987 | Platzer et al. | 430/192 |
| 4,672,021 | 6/1987 | Blumel et al. | 430/192 |
| 4,732,836 | 3/1988 | Potiur et al. | 430/192 |

FOREIGN PATENT DOCUMENTS 60-24545 2/1985 Japan .

*Primary Examiner*—Charles L. Bowers, Jr.
*Attorney, Agent, or Firm*—Burns, Doane, Swecker & Mathis

[57] ABSTRACT

A positive-working light-sensitive composition is herein disclosed, which comprises a mixed organic solvent consisting of (i) at least one organic solvent having a boiling point of at least 40° C. and less than 100° C., (ii) at least one organic solvent having a boiling point of at least 100° C. and less than 140° C., and (iii) at least one organic solvent having a boiling point of at least 140° C. and less than 210° C.; or (a) at least one organic solvent as defined in the above item (i), (b) at least one organic solvent as defined in the item (ii), (c) at least one organic solvent having a boiling point of at least 210° C., and optionally at least one solvent as defined in the item (iii), based on the total weight of the mixed solvent, the composition making it possible to extremely reduce load for drying and to impart excellent properties such as development latitude to the resultant light-sensitive layer and the composition being useful to produce PS plates according to a continuous process.

11 Claims, No Drawings

LIGHT-SENSITIVE POSITIVE WORKING, O-QUINONE DIAZIDE PRESENSITIZED PLATE WITH MIXED SOLVENT

BACKGROUND OF THE INVENTION

1. Field of the Invention

The present invention relates to light-sensitive compositions and more particularly to light-sensitive compositions which permit the reduction in drying load and are quick-drying compositions suitable for continuous coating.

2. Description of the Prior Art

Light-sensitive compositions have, in general, been used in a manner that they are coated on a support such as surface treated aluminum plates, paper, plastics or $SiO_2/Si$ wafer in the form of solution or dispersion in an organic solvent and then are dried. When the light-sensitive compositions are coated on a support and then are dried, it is quite important to select organic solvents to be used in order to sufficiently take advantages of the properties of the light-sensitive composition and from viewpoints of economy and safety.

On the other hand, if it is intended to industrially produce presensitized plates (hereunder referred to as "PS plate(s)" among others, it is quite effective to continuously coat a wet support with a light-sensitive composition and dry the composition coated, while continuously conveying the web support. However, in such case, the drying procedure should be carried out in a short period of time for the purposes of eliminating the use of a large and complicated drying installation and saving cost. For this purpose, it is required that solvents having a boiling point of from low range to middle range are used in a large amount. However, in such case, it was found that important properties of PS plates such as development latitude, developing capability (i.e., the area of a PS plate which can be developed without any appreciable decrease in sensitivity by a unit of developer), film strength, ink receptivity or the like are largely impaired or extremely lowered when a positive-working light-sensitive composition is coated and dried with utilizing solvent of a boiling point falling within the above range.

In addition, the use of a solvent combined with one having a high boiling point (e.g., 210° C. or more) is also known. For instance, Japanese Patent Appln. (opened to public inspection, hereunder referred to as "OPI" for simplicity) No. 60-24545 discloses a positive-working light-sensitive composition obtained by dissolving an alkali-soluble novolak resin and a 1,2-quinonediazide compound in a mixed solvent comprising (A) an organic solvent of a boiling point of from 60° to 170° C. and (B) an organic solvent of a boiling point of from 180° to 350° C. in a ratio, (A)/(B), of from 1 to 99 (weight ratio). This invention relates to a positive-working light-sensitive resin composition having a quite low striation, obtained by utilizing an alkali-soluble novolak resin as a major component and coating it on a support such as a silicon wafer according to spin coating technique. In other words, the invention intends to control the degree of drying during spin coating, by the addition of a high boiling point solvent Therefore, the use of such kind of composition requires a drying process over an extremely long period of time.

SUMMARY OF THE INVENTION

Under such circumstances, there has been a strong need for developing a quick-drying light-sensitive composition which permits the elimination of the use of a large scale and complicated drying installation and provides a light-sensitive layer having excellent desired properties such as development latitude, strength of the resultant film, developing capability or the like.

Accordingly, the principal object of this invention is to provide a light-sensitive composition from which a PS plate excellent in development latitude, developing capability, film strength, ink receptivity can be obtained by applying it to the surface of a support and drying.

Another purpose of this invention is to provide a light-sensitive composition which provides a PS plate having excellent properties such as development latitude, developing capability, film strength and ink receptivity by applying it to the surface of a support and then drying for an extremely short period of time.

A further object of this invention is to provide a light-sensitive composition capable of providing a PS plate having excellent properties such as development latitude, developing capability, film strength and ink receptivity by applying it to the surface of a support and drying with a simple drying apparatus.

The inventors of this invention have conducted various studies for overcoming the aforementioned disadvantages accompanied by the conventional techniques and found out that these disadvantages can effectively be eliminated by selecting a specific combination of organic solvents and thus completed the present invention.

According to an aspect of this invention, a light-sensitive composition is provided, which comprises a mixed solvent consisting of (i) at least one organic solvent having a boiling point of at least 40° C. and less than 100° C.; (ii) at least one organic solvent having a boiling point of at least 100° C. and less than 140° C.; and (iii) at least one organic solvent having a boiling point of at least 140° C. and less than 210° C.

According to another aspect of this invention, a light-sensitive composition is provided, which comprises a mixed solvent consisting of (a) at least one organic solvent having a boiling point of 40° C. or more and less than 100° C.; (b) at least one organic solvent having a boiling point of 100° C. or more and less than 140° C.; (c) at least one organic solvent having a boiling point of at least 210° C.; and optionally (d) at least one organic solvent having a boiling point of 140° C. or more and less than 210° C., the organic solvent (c) being present in an amount of 0.05 to 3% by weight based on the total weight of the mixed solvent

DETAILED DESCRIPTION OF THE INVENTION

The light-sensitive compositions of the present invention are advantageously used for a PS plate from which a lithographic printing plate is to be prepared, and therefore it will hereunder be explained more in detail with reference to such PS plates.

A support on which the light-sensitive composition is to be coated is a plate material having a high dimensional stability and can be any one of those used as conventional supports for printing plates Examples of such a support include paper with or without a laminated plastic sheet such as polyethylene, polypropylene, polystyrene; a metal plate such as aluminum (inclusive of aluminum alloys), zinc, iron, copper; a film or sheet of plastic such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal; or paper or a plastic film on which a metal film or sheet such as those mentioned above is laminated or deposited. Particularly preferred example thereof is an aluminum plate The aluminum plate includes a pure aluminum plate and an aluminum alloy plate. Such aluminum alloys include alloys of aluminum with a metal such as silicon, copper, manganese, magnesium, chromium, zinc, lead, bismuth and nickel. These alloys may also include a trace amount of impurities in addition to iron and titanium.

The support used in this invention may be subjected to surface treatment according to need. For example, the surface of a support is hydrophilized when it is used for making a PS plate from which a lithographic printing plate is to be prepared The hydrophilization of a support may be carried out by a so-called surface treatment, for instance, chemical treatment, exposure to discharge, flame treatment, exposure to UV rays, application of high frequency, glow discharge treatment, active plasma treatment, laser treatment which are disclosed in U.S. Pat. Nos. 2,764,520; 3,497,407; 3,145,242; 3,376,208; 3,072,483; 3,475,193; and 3,360,448 and British Pat. No. 788,365, if the support has a plastic surface. Further, the support may be coated with an underlying layer on the plastic surface thereof after such surface treatment.

The hydrophilization of support is also carried out by applying a plastic coating to the plastic surface of a support and a variety of methods therefor have been proposed. One such method (double-layer method) comprises applying a first hydrophobic resin layer having a good adhesion to the plastic surface and then applying a second hydrophilic resin layer thereon. Another method (single-layer method) comprises applying a resin layer, the polymer molecule constituting the resin including both hydrophobic groups and hydrophilic groups.

When a support used has a surface of a metal such as, in particular, aluminum, the surface is preferably subjected to surface treatment, for instance, graining; dipping treatment in an aqueous solution of sodium silicate, potassium fluorozirconate, phosphates or the like; or anodization. Moreover, there are also effectively used as a support, an aluminum plate which has peen subjected to graining followed by dipping it in an aqueous solution of sodium silicate (see, U.S. Pat. No. 2,714,066) and an aluminum plate which has been anodized and then dipped in an aqueous solution of an alkali metal silicate (see, U.S. Patent No. 3,181,461). The aforementioned anodization is effected by utilizing an aluminum plate as anode and supplying electric current therethrough in an electrolyte comprised of a nonaqueous or aqueous solution containing at least one of an inorganic acid such as phosphoric acid, chromic acid or sulfuric acid, boric acid or an organic acid such as oxalic acid or sulfamic acid.

In addition, it is also effective to utilize silicate electrodeposition for surface treatment (hydrophilization) of a support.

The hydrophilization of the surface of a support is effected not only to make the surface hydrophilic but also to prevent the detrimental reaction with a light-sensitive layer applied thereon from taking place and enhance the adhesion of the surface of the support to the light-sensitive layer.

It is also possible to optionally pretreat the surface of a support for the purposes of removing oils such as rolling oil from the surface and exposing a clean aluminum surface, prior to graining. There has been used, for example a solvent such as trichlene, a surfactant or the like for degreasing the surface. On the other hand, an alkali etching agent such as sodium hydroxide or potassium hydroxide is widely used for exposing the clean surface of the support.

The graining is effectively carried out according to mechanical, chemical or electrochemical methods. The mechanical methods include ball graining, blast graining, brush graining which comprises rubbing the surface to be grained with an aqueous slurry of an abrasive material such as pumice powder and a nylon brush. A preferred example of the chemical method comprises immersing the support in a saturated aqueous solution of a mineral acid salt of aluminum disclosed in Japanese Patent Application (OPI) No. 54-31187. A preferred electrochemical method comprises electrolyzing with alternating electric current in an acidic electrolyte composed of hydrochloric acid, nitric acid or the mixture thereof. Among these surface roughening treatment, the method for surface roughening comprising a combination of a mechanical and an electrochemical roughening treatment is particularly preferred in view of the strong adhesion of resin images to the support [see Japanese Patent Application (OPI) No. 55137993].

The graining according to the aforementioned methods is preferably carried out until the center line average surface roughness (Ha) reaches 0.3 to 1.0$\mu$.

The aluminum plate thus grained is then subjected to water washing and chemical etching treatment according to need.

Such an etching liquid is usually selected from aqueous solutions of a base or an acid which can dissolve aluminum therein. In this respect, it is necessary that the etching liquid does not form a film other than aluminum film, derived from components of the etching liquid, on the etched surface. Examples of the preferred etching agent include basic materials such as sodium hydroxide, potassium hydroxide, trisodium phosphate, disodium phosphate, tripotassium phosphate, dipotassium phosphate; and acidic materials such as sulfuric acid, persulfuric acid, phosphoric acid, hydrochloric acid and salts thereof. However, salts of a metal such as zinc, chromium, cobalt, nickel, copper having an ionization tendency lower than that of aluminum are not desirable since they have a tendency to form an undesired film on the etched surface.

The concentration and temperature of the etching liquid are not critical, but they are most preferably determined so that the dissolution rate of aluminum or an alloy thereof used is 0.3 to 40 g/m$^2$ per one minute of immersion time.

The etching is preferably effected by, for instance, immersing an aluminum plate in an etching liquid or applying an etching liquid to the surface of an aluminum plate to be treated so that the total amount of aluminum removed by etching falls within the range of from 0.5 to 10 g/m$^2$.

It is preferred to use an aqueous solution of a base as such etching agent because of its high etching rate. In this case, smut is in general formed during the etching procedure and thus the aluminum plate is desmutted with an acid. The acid used in the desmutting treatment includes nitric acid, sulfuric acid, phosphoric acid, chromic acid, hydrofluoric acid, borofluoric acid or the like.

The aluminum plate etched may be washed with water and anodized according to need. The anodization can be carried out in a manner conventionally utilized in the art. The anodization film can be formed on an aluminum plate by supplying alternating current or direct current in a nonaqueous or an aqueous solution containing at least one member selected from the group consisting of sulfuric acid, phosphoric acid, chromic acid, oxalic acid, sulfamic acid, benzenesulfonic acid.

The conditions for anodization vary depending on the kind of electrolyte used and, in general, the anodization is desirably carried out under the conditions such that the concentration of the electrolyte is 1 to 80% by weight, the temperature thereof is 5° to 70° C., the current density is 0.5 to 60 A/dm$^2$, the voltage applied is 1 to 100V and the electrolysis time is between 30 seconds to 50 minutes.

Among these anodization processes, preferred are those disclosed in British Patent No. 1,412,768 in which an aluminum plate is anodized under a high current density in sulfuric acid and disclosed in U.S. Pat. No. 3,511,661 in which the anodization is carried out in phosphoric acid as electrolyte.

The aluminum plate thus roughened and anodized may be subjected to hydrophilization treatment according to need. Preferred methods therefor are those disclosed in U.S. Pat. Nos. 2,714,066 and 3,181,461 in which the plate is treated with an aqueous solution of an alkali metal silicate such as sodium silicate, disclosed in Japanese Pat. Publn. No. 36-22063 in which the plate is treated with potassium fluorozirconate and disclosed in U.S. Pat. No. 4,153,461 in which polyvinyl phosphonic acid is used to treat the plate On the aluminum plate thus surface treated, a layer free from a light-sensitive material may be formed according to need. Materials of such layer include gum arabic, carboxymethyl cellulose, carboxyethyl cellulose, carboxymethyl hydroxyethyl cellulose, alginic acid, polyacrylic acid, derivatives of acrylic acid, condensed copolymer of vinyl ethyl ether and anhydrous maleic acid, copolymer of vinyl acetate and anhydrous maleic acid, and salts thereof and water-soluble metal salts such as zinc acetate or yellow dyes, amine salts and finely divided particles of silica and titanium dioxide.

A light-sensitive composition, preferably of a positive-working type, is then applied to the surface of the aluminum support thus obtained to form a light-sensitive layer. The positive-working light-sensitive composition as used herein comprises o-quinonediazide compounds and particularly preferred are comprised of o-quinonediazide and phenolic resin.

The o-quinonediazide compounds which can be used in the present invention are those having at least one o-quinonediazide group and which increase their solubility in an alkaline solution upon exposure to actinic light. Such compounds include those of various chemical structures and examples thereof are disclosed in detail in "Light-Sensitive System", pp 339–352, by J. Kosar, published by John Wiley & Sons, Inc. Particularly preferred are sulfonic acid esters or sulfonamides of o-quinonediazide derivatives obtained by reacting o-quinonediazide with different kinds of aromatic polyhydroxyl compounds or amines. The most preferred examples of the o-quinonediazide compounds are an ester of benzoquinone-(1,2)-diazido sulfonic acid chloride and polyhydroxyphenyl or an ester of naphthoquinone-(1,2)-diazido sulfonic acid chloride and pyrogallol-acetone resin as disclosed in Japanese Pat. Publn. No. 43-28403. Other preferred o-quinonediazide compounds include esters of benzoquinone-(1,2)-diazido sulfonic acid chloride or naphthoquinone-(1,2)-diazido sulfonic acid chloride and phenol-formaldehyde resin as described in U.S. Pat. Nos. 3,046,120 and 3,188,210. Other useful o-quinonediazide compounds as used herein are those disclosed in Patents such as Japanese Patent Appln. (OPI) Nos. 47-5303; 48-63802; 48-63803; 48-96575; 49-38701; 48-13354; 41-11222; 45-9610 and 49-17481; U.S. Pat. Nos. 2,797,213; 3,454,400; 3,544,323; 3,573,917; 3,674,495 and 3,785,825; British Pat. Nos. 1,227,602; 1,251,345; 1,267,005; 1,329,888 and 1,330,932; West German Pat. No. 854,890 or the like.

The term "phenol resin" as used herein means novolak resins and polyvinyl compounds having phenolic hydroxyl groups. The novolak resins are products obtained by condensing phenols and formaldehydes under the presence of an acid catalyst, which also include those modified with xylene or mesitylene. As typical examples of such novolak resin, there may be mentioned phenol-formaldehyde resin, cresolformaldehyde resin, phenol-cresol-formaldehyde resin, p-tert-butylphenol-formaldehyde resin and phenol-modified xylene resin.

The polyvinyl compounds having phenolic hydroxyl groups are, for instance, polyhydroxystyrene polymer and copolymers thereof, and polymer and copolymers of halogenated polyhydroxystyrene.

The amount of the o-quinonediazide compound present in the light-sensitive composition falls within the range of from 10 to 50% by weight, preferably from 20 to 40% by weight based on the total weight of the composition. While the amount of the phenolic resin incorporated in the light-sensitive composition is in the range of from 45 to 79% by weight, preferably from 50 to 70% by weight based on the total weight of the composition The light-sensitive composition according to the present invention may contain a dye for image discrimination such as Crystal Violet, Methyl Violet, Malachite Green, Fuchsine, Parafuchsine, Victoria Blue BH (manufactured and sold by HODOGAYA CHEMICALS IND. INC.), Victoria Pure Blue BOH (HODOGAYA CHEMICALS IND. INC.), Oil Blue #603 (manufactured and sold by ORIENT CHEMICALS IND. INC.), Oil Pink #312 (ORIENT CHEMICALS IND. INC.), Oil Red 5B (ORIENT CHEMICALS IND. INC.), Oil Green #502 (ORIENT CHEMICALS IND. INC.). These dyes are used alone or in combination in an amount of from 0.3 to 15% by weight based on the total weight of the light-sensitive composition. It may also contain a compound capable of generating photodecomposition products which interact with the dye mentioned above to cause change in color tone thereof, such as o-naphthoquinone diazido-4-sulfonic acid halogenide described in Japanese Patent Appln. (OPI) No. 50-36209, trihalomethyl-2-pyrrone and trihalomethyl triazine disclosed in Japanese patent application (OPI) No. 53-36223, o-naphthoquinone diazide compounds disclosed in Japanese Patent Appln. (OPI) No. 55-62444, 2-trihalomethyl-5-aryl-1,3,4-oxadiazole compounds described in Japanese Patent Appln. (OPI) No. 55-77742. These additives may be used alone or in combination, preferably in an amount of from 0.3 to 15% by weight based on the total weight of the composition.

An anhydrous acid compound may also be added to the light-sensitive composition according to the present invention, examples of which are disclosed in Japanese Patent Appln. (OPI) No. 52-80022, for the purpose of increasing the sensitivity of the composition.

Moreover, it may also be possible to add a fluorine-containing surfactant to these light-sensitive composition of this invention so as to improve the coating property thereof The fluorine-containing surfactant which can preferably be used in the invention is a copolymer of (i) an acrylate or a methacrylate having a fluoroaliphatic group (Rf) which has 3 to 20 carbon atoms and at least 40% by weight of fluorine atoms and at least three terminal carbon atoms of which are fully fluorinated and (ii) poly(oxyalkylene)acrylate or poly(oxyalkylene)methacrylate, the Rf group containing acrylate or Rf group-containing methacrylate monomer unit being included in the copolymer in an amount of 10 to 70% by weight based on the weight of the copolymer. The use of such fluorine-containing surfactant permits the formation of a uniform light-sensitive layer on a support even if a large amount of a low boiling point solvent is utilized.

The fluoroaliphatic group Rf is, in general, a saturated and monovalent aliphatic group. The group Rf may be a linear or branched chain or a cyclic or an alicyclic group such as an alkylcycloaliphatic group in the case where the group has a sufficiently large number of carbon atoms. The fluoroaliphatic skeletal chain may have heteroatoms such as oxygen and/or trivalent nitrogen atoms which are bonded dominantly to carbon atoms, which provide a stable bond between fluorinated carbon chains and exert no influence on the inert property of the Rf group. In order to attain a sufficient intended effect, the Rf group should have 3 to 20 carbon atoms, preferably 6 to 12 carbon atoms and the content of fluorine atoms bonded to carbon atoms should be at least 40% by weight, preferably at least 50% by weight based on the total weight of the Rf group. As already mentioned, at least three terminal carbon atoms are fully fluorinated. The Rf group is, for instance, $CF_3CF_2CF_2-$ and preferred examples thereof are an alkyl group which is almost completely or sufficiently fluorinated such as those represented by the formula:

$C_nF_{2n+1}$ (n is an integer of at least 3).

The desired effect (improvement in coating property) of the present invention cannot be attained if the fluorine atom content of the Rf group is less than 40% by weight. A more excellent effect is expected when fluorine atoms bonded to carbon atoms in the group Rf are localized at the vicinity of the terminal end thereof. Although it is possible to increase the fluorine content even if the Rf group has not more than two carbon atoms, the total fluorine content becomes insufficient and therefore, the desired effect cannot be expected. Moreover, a satisfactory result cannot be obtained even if the fluorine content is increased by increasing the ratio of sufficiently fluorinated monomer having at most two carbon atoms to the resultant copolymer. This is because the requirement of localization of fluorine atoms at the vicinity of the terminal end is not assured.

On the other hand, the desired sufficient effect cannot be expected when the number of carbon atoms contained in Rf group is more than 20. This stems from the facts that the solubility of the resultant copolymer in a solvent is extremely reduced if the fluorine content is extremely high and that when the fluorine content is low, the localization of the fluorine atoms is not assured.

The soluble moiety of the copolymer is poly(oxyalkylene) group, $(OR')_x$ wherein R' is an alkylene group having 2 to 4 carbon atoms and, for instance, $-CH_2CH_2-$, $-CH_2CH_2CH_2-$, $-CH(CH_3)CH_2-$ or $-CH(CH_3)CH(CH_3)-$ is preferred. The oxyalkylene units in the poly(oxyalkylene) group may be identical with each other as in poly(oxypropylene) or may be at least two different oxyalkylene group randomly arranged in the poly(oxyalkylene) chain. Moreover, the units may be linear or branched oxypropylene and oxyethylene units or may be distributed in the poly(oxyalkylene) chain as linear or branched oxypropylene blocks and oxyethylene blocks. This poly(oxyalkylene) chain may have or include at least one chain such as

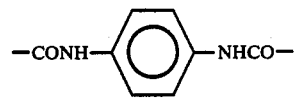

and $-S-$ in its skeleton. When such chain is at least trivalent, the chain provides a branched oxyalkylene units in the poly(oxyalkylene). In order to assure the desired solubility of the copolymer upon adding it to the light-sensitive composition, the molecular weight of the poly(oxyalkylene) group should fall within the range of from 250 to 2,500.

The copolymer used in the composition of this invention can be produced by the free-radical-initiated polymerization of, for instance, fluoroaliphatic group-containing acrylate or fluoroaliphatic group-containing methacrylate and poly(oxyalkylene)acrylate or poly(oxyalkylene)methacrylate such as monoacrylate or diacrylate or a mixture thereof The molecular weight of a polyacrylate oligomer can be controlled by adjusting the concentration of the initiator used and activity thereof, the amount of monomers and the temperature of the polymerization reaction and further by the addition of a chain transfer agent such as thiols, for instance, n-octylmercaptan. For example, a copolymer having the following repeating units can be obtained by copolymerizing a fluoroaliphatic group-containing acrylate, $Rf-R''-O_2C-CH=CH_2$ (wherein R'' is, for instance, a sulfonamide alkylene, a carbonamide alkylene or an alkylene group) such as $C_8F_{17}SO_2N(C_4H_9)CH_2CH_2O_2CCH=CH_2$ and a poly(oxyalkylene)monoacrylate, $CH_2=CHC(O)(OR')_xOCH_3$:

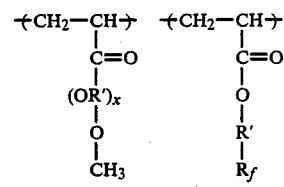

The aforementioned fluoroaliphatic group-containing acrylate is disclosed in U.S. Pat. Nos. 2,803,615; 2,642,416; 2,826,564; 3,102,103; 3,282,905 and 3,304,278.

The poly(oxyalkylene)acrylate and other acrylates which can be used to form the copolymer may be prepared by reacting commercially available hydroxy poly(oxyalkylene) materials such as Pluronic (manufactured and sold by ASAHI DENKA KOGYO K.K.), ADEKA Polyether (ASAHI DENKA KOGYO K.K.), Carbowax (manufactured and sold by GLYCO PRODUCTS CO.), Triton (manufactured and sold by ROHM & HAAS CO.) and P.E.G. (available from DAI-ICHI KOGYO SEIYAKU CO., LTD.) with acrylic acid, methacrylic acid, acrylchloride or acrylic acid anhydride in a known manner.

Alternatively, a polyacrylate copolymer having the following repeating units may be obtained by copolymerizing a poly(oxyalkylene)diacrylate prepared in a known method, $CH_2=CHCO_2(R'O)_xCOCH=CH_2$, such as $CH_2=CHCO_2\text{-}(C_2H_4O)_{10}(C_3H_6O)_{22}(C_2H_4O)_{10}COCH=CH_2$ with one of the above fluoroaliphatic group-containing acrylates:

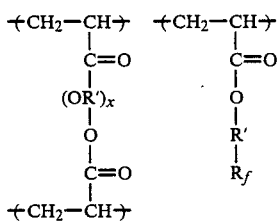

Other ethylenic unsaturated monomers having a fluoroaliphatic group at the terminal end which is suitable to form the copolymer used in the composition of the present invention are those disclosed in U.S. Pat. Nos. 2,592,069; 2,995,542; 3,078,245; 3,081,274; 3,291,843 and 3,325,163, while U.S. Pat. No. 3,574,791 discloses ethylenic unsaturated monomers useful for obtaining the aforementioned ethylenic unsaturated monomers having a fluoroaliphatic group at its terminal end.

The copolymer as used in the light-sensitive composition of this invention is the copolymer (oligomer) of a fluoroaliphatic group-containing acrylate or a fluoroaliphatic group-containing methacrylate with a poly(oxyalkylene) acrylate or a poly(oxyalkylene)methacrylate and the copolymer has the content of the fluoroaliphatic group-containing monomer of from 10 to 70% by weight based on the weight of the copolymer. The desired effect (i.e., improvement in coating property of the resultant light-sensitive composition) cannot be expected if the amount of the fluoroaliphatic group-containing monomer used is less than 10% by weight. On the contrary, the solubility of the copolymer in a solvent is extremely lowered if the amount of the monomer used is more than the upper limit i.e., 70% by weight The molecular weight of the copolymer as used herein is preferably in the range of from 2,500 to 100,000. That is, a satisfactory effect is not attained if the molecular weight of the copolymer is less than 2,500 while if it exceeds 100,000, the solubility thereof in a solvent is remarkably reduced Preferred copolymers used in the present invention are those obtained by utilizing the fluoroaliphatic group-containing acrylate as one component of the fluoroaliphatic group-containing monomers in an amount of from 50 to 100% by weight with respect to the total amount of the latter and utilizing the poly(oxyalkylene)acrylate monomer unit in an amount of at least 15% by weight based on the total weight of the copolymer and in particular the copolymer obtained from a fluoroaliphatic group-containing acrylate and a poly(oxyalkylene)acrylate is preferred in the present invention. If the content of the fluoroaliphatic group-containing methacrylate in the fluoroaliphatic group-containing monomers exceeds 50% by weight, the solubility of the copolymer is largely lowered. Moreover, when the amount of the poly(oxyalkylene)acrylate monomer is less than 15% by weight based on the total weight of the copolymer, the resultant coated film (light-sensitive layer) tends to have pin holes.

The preferred amount of the fluorine-containing surfactant falls within the range of from 0.01 to 5% by weight, more preferably from 0.05 to 3% by weight based on the weight of the light-sensitive composition (the total weight of coating components except for solvent). An insufficient effect is attained if the amount of the fluorine-containing surfactant used is less than 0.01% by weight. On the contrary, if the amount thereof is more than 5% by weight, a sufficient drying of the coated film is not accomplished and the performances, e.g., development property is largely impaired.

In addition, a filler, a plasticizer or the like may also be added to the light-sensitive composition according to the present invention for various purposes The plasticizer is used to improve physical properties of the resulting coated film and examples thereof include dibutyl phthalate, butyl glycolate, tricresyl phosphate and dioctyl adipate. The addition of fillers makes it possible to further enhance physical properties of a resultant coated film and mat the surface of a light-sensitive layer as well as to improve the adherence under vacuum during exposing images and as a result, the formation of blur during exposure to light can effectively be prevented. Examples of such fillers include, for instance, talc powder, glass powder, clay, starch, wheat powder, maize meal, polytetrafluoroethylene (Teflon) powder.

According to one important aspect of this invention, each component of the aforementioned light-sensitive composition is dissolved or dispersed in a mixture of the following organic solvents, then coated on the support explained above and dried to obtain, for instance, PS plates:

(i) At least one organic solvent, the boiling point of which is 40° C. or more and less than 100° C.;

(ii) At least one organic solvent having a boiling point of 100° C. or more and less than 140° C.; and (iii) At least one organic solvent having a boiling point of 140° C. or more and less than 210° C.

Examples of the organic solvent belonging to the group (i) (having a boiling point: B.P. of 40° C. or more and less than 100° C.) are, methyl alcohol (B.P.=64.5° C.), ethyl alcohol (B.P.=78.3° C.), n-propyl alcohol (B.P.=97.2° C.), iso-propyl alcohol (B.P.=82.3° C.), sec-butyl alcohol (B.P.=99.5° C.), acetone (B.P.=56.2° C.), methyl ethyl ketone (B.P.=79.6° C.), benzene (B.P.=80.1° C.), cyclohexane (B.P.=80.7° C.), methyl acetate (B.P.=57.8° C.), ethyl acetate (B.P.=77.1° C.), isopropyl acetate (B.P.=89° C.), ethyl formate (B.P.=54.3° C.), propyl formate (B.P.=81.3° C.), iso-butyl formate (B.P.=98° C.), methyl propionate (B.P.=79.7° C.), ethyl propionate (B.P.=99.1° C.), chloroform (B.P.=61.2° C.), carbon tetrachloride (B.P.=76.7° C.), methylene dichloride (B.P.=40.4° C.), ethylene dichloride (B.P.=83.5° C.), 1,1,1-trichloroethane (B.P.=74° C.), iso-propyl ether (B.P.=68.3° C.), tetrahydrofuran (B.P.=66° C.), tetrahydropyran (B.P.=88° C.) and ethylene glycol dimethyl ether (B.P.=85.2° C.).

As the organic solvent of the group (ii) (having a B.P.=of 100° C. or more and less than 140° C., there may be mentioned n-butyl alcohol (B.P.=117.7° C.), iso-butyl alcohol (B.P.=107.9° C.), methyl n-propyl ketone (B.P.=103.3° C.); methyl n-butyl ketone (B.P.=127.5° C.), methyl iso-butyl ketone (B.P.=115.9° C.), diethyl ketone (B.P.=102.2° C.), toluene (B.P.=110.6° C.), m-xylene (B.P.=139.1° C.), p-xylene (B.P.=138.4° C.), n-propyl acetate (B.P.=101.6° C.), n-butyl acetate (B.P.=126.5° C.), iso-butyl acetate (B.P.=118.3° C.), sec-butyl acetate (B.P.=112.5° C.), n-butyl formate (B.P.= 106.8° C.), amyl formate (B.P.=130.4° C.), methyl butyrate (B.P.=102.3° C.), ethyl butyrate (B.P.=121.3° C.), monochlorobenzene (B.P.=131.5° C.), dioxane (B.P.=101.3° C.), ethylene glycol monomethyl ether (B.P.=124.4° C.), ethylene glycol monoethyl ether (B.P.=134.8° C.), ethylene glycol diethyl ether (B.P.=121.1° C.), propylene glycol monomethyl ether (B.P.=120° C.) and propylene glycol monoethyl ether (B.P.=132.2° C.).

Finally, the organic solvents belonging to the group (iii) (having a boiling point of 140° C. or more and less than 210° C.) are, for instance, methyl n-amyl ketone (B.P.=150.2° C.), methyl n-hexyl ketone (B.P.=172.9°-173.5° C.), ethyl n-butyl ketone (B.P.=147.8° C.), di-n-propyl ketone (B.P.=143.7° C.), di-iso-butyl ketone (B.P.=168.1° C.), acetylacetone (B.P.=140° C.), cyclohexanone (B.P.=155.7° C.), methyl cyclohexanone (B.P.=169°-170.5° C.), diacetone alcohol (B.P.=167.9° C.), acetonylacetone (B.P.=192°-194° C.), oxylene (B.P.=144.4° C.), n-amyl acetate (B.P.=147.6° C.), iso-amyl acetate (B.P.=142.5° C.), methylisoamyl acetate (B.P.=146.3° C.), methoxybutyl acetate (B.P.=173° C.), sec-hexyl acetate (B.P.=146.3° C.), 2-ethylbutyl acetate (B.P.=162.4° C.), cyclohexyl acetate (B.P.=173.5°-174.5° C.), methyl acetoacetate (B.P.=169.5° C.), ethyl acetoacetge (B.P.=180.8° C.), n-butyl propionate (B.P.=145.4° C.), n-butyl butyrate (B.P.=166.4° C.), iso-amyl butyrate (B.P.=184.8° C.), n-butyl ether (B.P.=142° C.), 2-ethoxytetrahydropyran (B.P.=147° C.), ethylene glycol monomethyl ether acetate (B.P.=145.1° C.), ethylene glycol monoethyl ether acetate (B.P.= 156.4° C.), ethylene glycol monoisopropyl ether (B.P.=139°-143° C.), ethylene glycol monobutyl ether (B.P.=171.2° C.), ethylene glycol monoisobutyl ether (B.P.=160.5° C.), ethylene glycol dibutyl ether (B.P.=203.6° C.), ethylene glycol monobutyl ether acetate (B.P.=191.5° C.), ethylene glycol isoamyl ether (B.P.=181° C.), ethylene glycol monohexyl ether (B.P.=208.1° C.), ethylene glycol monoacetate (B.P.=182° C.), ethylene glycol diacetate (B.P.=190.2° C.), methoxymethyoxy ethanol (B.P.=167.5° C.), diethylene glycol monomethyl ether (B.P.=194.2° C.), diethylene glycol monoethyl ether (B.P.=201.9° C.), diethylene glycol dimethyl ether (B.P.=162° C.), diethylene glycol methyl ethyl ether (B.P.=170°-180° C.), diethylene glycol diethyl ether (B.P.=188.9° C.), diethylene glycol monoisopropyl ether (B.P.=207.3° C.), propylene glycol (B.P.=188.2° C.), propylene glycol monomethyl ether acetate (B.P.=145.4° C.), propylene glycol monoethyl ether acetate, propylene glycol monobutyl ether (B.P.=171.1° C.), dipropylene glycol monomethyl ether (B.P.=190° C.), dipropylene glycol monoethyl ether (B.P.=197.8° C.), dipropylene glycol dimethyl ether, dipropylene glycol methyl ethyl ether, dipropylene glycol diethyl ether, hexylene glycol (B.P.=197.1° C.), 3-methoxy-3-methoxy butanol (B.P.=174° C.), N,N-dimethyl formamide (B.P.=149.6° C.), dimethyl sulfoxide (B.P.=189° C.), γ-butyrolactone (B.P.=203°-204° C.) and γ-valerolactone (B.P.=205°-207° C.).

Among these solvents, there is no restriction with respect to the organic solvents (i) having a boiling point of 40° C. or more and less than 100° C., since they are quickly evaporated during drying compared with the solvents (ii) and (iii). While with reference to the organic solvents (ii) and (iii), each of them should include at least one solvent which can easily dissolve the components of the light-sensitive composition except for the organic solvents, and in particular in the case where at least two solvents are selected from each group, it is preferred that the solvent having the highest boiling point among the solvents selected from the group (ii) or (iii) satisfactorily dissolves the components of the light-sensitive composition.

The solvent which satisfactorily dissolves the component of the light-sensitive composition and belongs to the group (ii) includes, for instance, ketones, esters, ethylene glycol (or propylene glycol) mono-($C_1$ to $C_2$)alkyl ethers or diethyl ether, preferred examples are ketones, ethylene glycol (or propylene glycol) mono($C_1$ to $C_2$)alkyl ether and the most preferred are methyl isobutyl ketone and propylene glycol monomethyl (or ethyl) ether.

Moreover, the organic solvent which satisfactorily dissolves the components of the light-sensitive composition and belongs to the group (iii) includes, for instance, ketones; ethylene glycol (or propylene glycol) mono-($C_3$ to $C_6$)alkyl ethers or mono($C_1$ to $C_4$)alkyl ether acetates; diethylene glycol (or dipropylene glycol) mono($C_1$ to $C_3$)alkyl ethers or di($C_1$ to $C_2$)alkyl ethers or methyl ethyl ether; N,N-dimethylformamide; dimethyl sulfoxide; γ-butyrolactone, and preferred examples thereof include, for example, acetylacetone, cyclohexanone, diacetone alcohol, ethylene glycol mono($C_1$ to $C_4$)alkyl ether acetates, diethylene glycol (or dipropylene glycol) di($C_1$ to $C_2$)alkyl ethers or methyl ethyl ether, N,N-dimethylformamide, dimethyl sulfoxide, and γ-butyrolactone.

In the mixed solvent as used herein, the amount of the solvents belonging to each group is as follows:
Group (i) 20 to 70% by weight;
Group (ii) 10 to 79% by weight; and
Group (iii) 0.1 to 30% by weight
provided that these amounts are calculated based on the total weight of all the solvents included in the mixed solvent.

According to another important aspect of this invention, every components of the aforementioned light-sensitive composition is dissolved or dispersed in a mixture (mixed organic solvent) comprising (a) at least one organic solvent having a boiling point of 40° C. or more and less than 100° C.; (b) at least one organic solvent having a boiling point of 100° C. or more and less than 140° C.; (c) at least one organic solvent having a boiling point of at least 210° C.; and optionally (d) at least one organic solvent having a boiling point of 140° C. or more and less than 210° C.

The organic solvents (a), (b) and (d) are, respectively, equivalent to those of the groups (i), (ii) and (iii) explained above with reference to the first embodiment of the present invention.

Examples of the organic solvent belonging to the group (c) and having a boiling point (B.P.) of at least 210° C. include, for instance, ethylene glycol monophenyl ether (B.P.=244.7° C.), ethylene glycol monophenyl ether acetate (B.P.=259.7° C.), ethylene glycol benzyl ether (B.P.=256° C.), ethylene glycol monobutyrate (B.P.=220° C.), ethylene glycol dipropionate (B.P.=210.3° C.), ethylene glycol dibutyrate (B.P.=240° C.), diethylene glycol monomethyl ether acetate, diethylene glycol monoethyl ether acetate (B.P.=217.4° C.), diethylene glycol monobutyl ether (B.P.=230.4° C.), diethylene glycol monoisobutyl ether (B.P.=220° C.), diethylene glycol monobutyl ether acetate (B.P.=246.8° C.), diethylene glycol dibutyl ether (B.P.=254.6° C.), diethylene glycol monoacetate, diethylene glycol diacetate (B.P.=250° C.), dipropylene glycol monoethyl ether acetate, triethylene glycol monomethyl ether (B.P.=249° C.), triethylene glycol monoethyl ether (B.P.=255.9° C.), triethylene glycol monobutyl ether (B.P.=271.2° C.), triethylene glycol dimethyl ether (B.P.=216° C.), triglycol dichloride (B.P.=240.9° C.), 1-butoxyethoxy propanol (B.P.=229.4° C.), tripropylene glycol monomethyl ether (B.P.=243° C.), tetraethylene glycol dimethyl ether (B.P.=275.3° C.).

When the mixed organic solvent used in the second embodiment comprises one organic solvent each selected from the groups (b) to (d), the solvent to be selected should be one capable of easily dissolving the components of the light-sensitive composition other than the organic solvents. On the other hand, if at least two organic solvents are selected from one of the groups (b) to (d), at least one solvent selected must be one in which the components of the light-sensitive composition other than the organic solvent are easily soluble. The solvent capable of easily dissolving such components preferably has the highest being point among these selected solvents. As in the case of the first embodiment, there is no restriction about the organic solvents (a), since they can easily be evaporated compared with those of the groups (b) to (d).

Examples of the solvents capable of easily dissolving the components of the light-sensitive composition and belonging to the groups (b) and (d) are identical to those defined above in connection with the groups (ii) and (iii) (the first embodiment) respectively. While, as such examples of the organic solvents belonging to the group (c), there may be mentioned derivatives of polyols (e.g., ethylene glycol, propylene glycol, diethylene glycol, dipropylene glycol, triethylene glycol, tripropylene glycol and tetraethylene glycol), such as monoalkyl ethers, monoalkyl ether esters (in particular, monoalkyl ether acetates), dialkyl ethers, monoesters and diesters among those defined above.

In the mixed solvent as used in the second embodiment of the present invention, the solvents belonging to each group are used in an amount defined below:
Group (a) 20 to 70% by weight;
Group (b) 10 to 79% by weight;
Group (c) 0.05 to 3% by weight; and
Group (d) 0 to 30% by weight,
these amounts being based on the total weight of all the organic solvents included in the mixed solvent.

In these embodiments, the boiling point of the organic solvents belonging to the groups (i) and (a) should be 40° C. or more and less than 100° C. This is because, if the boiling point thereof is less than 40° C., it is required to cool the composition during coating it on a support and further it is rather difficult to form a light-sensitive composition including such a volatile solvent. While, although the load for drying a coated light-sensitive composition gradually decreases as the amount of the solvents (i) or (a) used increases, the composition containing a large amount of such solvents is quickly dried and this leads to the formation of a light-sensitive layer having a relatively low uniformity in its thickness. That is, if the solvents (i) or (a) are used in an amount less than 20% by weight (this means that the amount of the solvents having a high boiling point becomes large), the load for drying becomes extremely large, while it is difficult to obtain a light-sensitive layer having a uniform thickness when the amount thereof exceeds 70% by weight. Therefore, the solvents (i) or (a) is preferably used in an amount defined above. It is preferred that the fluorine-containing surfactant as explained above is incorporated in the composition, if a large amount of the solvents (i) or (a) is utilized.

If the organic solvents (ii) or (b) are used in an amount of less than 10% by weight, the load for drying becomes extremely high when the amount of the solvents (i) or (a) is incomplete, while desired properties of the resulting light-sensitive layer are not expected due to the abrupt change in solvent composition from the group (i) or (a) to the group (iii) or (d) when a sufficient amount of the solvents (i) or (a) is present. While, if the solvents (ii) or (b) are present in an amount more than 79% by weight, the load for drying becomes extremely high. Therefore, the amount of the organic solvents (ii) or (b) should be in the range of from 10 to 79% by weight in the mixed solvent.

In the first embodiment, the organic solvents (iii) should have a boiling point of 140° C. or more and less than 210° C. The upper limit is defined due to the fact that the use of solvents having a boiling point of more than 210° C. leads to the increase in the drying load and the reduction in the strength of the resulting light-sensitive layer because most of them remains in the layer even when the drying is carried out sufficiently long period of time. If the solvent (iii) is used in an amount less than 0.1% by weight, a desired effect is not attained and on the contrary if it is present in an amount more than 30% by weight, the drying load becomes extremely large. Thus, the amount of the solvent (iii) is used in an amount defined above. In general, solvents having a relatively low boiling point (from 140 to 150° C.) among the group (iii) should be used in a relatively large amount (from 5 to 30% by weight), while those of a relatively high boiling point (between 180 and 210° C.) are used in a small amount (0.1 to 5% by weight), thereby a sufficient effect being expected. The use of the latter in a large amount results in the increase in the drying load and, in this case, a large amount thereof remains in the resulting layer even after drying operations. For this reason, preferred are those having a boiling point of 150° C. or more and less than 180° C. and in particular diethylene glycol dimethyl ether (B.P.=162° C.) provides a light-sensitive layer having a stable and excellent quality, over a wide range of its amount added.

In the second embodiment of this invention, solvents having a boiling points of 210° C. or more [group (c)] are used. This is contrary to the first embodiment. However, an excellent and intended effect is surely expected if it is used in a predetermined limited amount. Therefore, the amount thereof is critical and if it is used in an amount less than 0.05% by weight, the desired effect is not attained, while if the amount thereof exceeds 3% by weight, the drying load becomes large and further a significant part of them remains without evaporated even after drying. Thus, the amount of the organic solvents (c) should fall within the range of from 0.05 to 3% by weight.

The mixed solvent as used in the second embodiment may further contain an optional organic solvent [group (d)]having a boiling point of 140° C. or more and less than 210° C. These solvents may present in the mixed solvent in an amount of from 0 to 30% by weight. The upper limit is important in the light of the drying load, that is the drying load becomes extremely large when it exceeds 30% by weight. As in the first embodiment, the solvents having a relatively low boiling point (from 140 to 180° C.) among those belonging to the group (d) may be used in a relatively large amount, while those having a relatively high boiling point (between 180° to 210° C.) is preferably be used in a relatively small amount (0 to 5% by weight).

The aforementioned light-sensitive compositions are dispersed or dissolved in the mixed solvent explained before so that the concentration of solid contents falls within the range of from 2 to 50% by weight, then coated on a support and dried.

Even when the light-sensitive composition according to the present invention is quickly dried after coating, a light-sensitive layer having satisfactory properties can be obtained because the drying load is small due to the use of the mixed solvent explained above. It is believed that a light-sensitive layer or film having a uniform thickness can be produced since the coated layer of the composition is dried while causing a proper change in the solvent composition.

The composition according to the present invention may be applied to a support by conventional methods such as roll coating, reverse roll coating, dip coating, air knife coating, gravure coating, gravure offset coating, hopper coating, blade coating, rod coating, wire doctor coating, spray coating, curtain coating and extrusion coating. The amount of the composition applied to a support is preferably in the range of from 10 ml/m$^2$ to 100 ml/m$^2$ (the amount of liquid applied).

The composition applied to the surface of the support is then dried to form a uniform light-sensitive layer. This drying process is in general carried out with hot air. The temperature of the drying air is usually 30° to 200° C., preferably 40° to 140° C. The drying operation may be effected under a condition of a constant temperature. Alternatively, the drying temperature may be stepwise increased during drying operation.

In some cases, a satisfactory result is obtained using dehumidified air for drying. The hot air for drying is supplied in a rate of 0.1 to 30 m/sec, preferably 0.5 to 20 m/sec to the coated surface to be dried.

Thus, according to the light-sensitive composition of this invention, the drying load during drying procedure for a coated light-sensitive layer can remarkably be reduced, which, in turn, makes it possible to greatly simplify the construction of an installation for drying used and to sufficiently take advantages of performances thereof such as development latitude of PS plates.

Moreover, the light-sensitive composition according to the present invention is particularly effective in preparing a PS plate from which a lithographic printing plate is to be prepared, by continuously conveying a web support, successively coating the light-sensitive composition dissolved or dispersed in an organic solvent on the support and drying.

The light-sensitive composition according to the present invention will hereunder be explained in more detail with reference to working examples and the effects practically attained will also be discussed in comparison with comparative examples. In the following Examples, "%" means "% by weight" unless otherwise specified.

EXAMPLES 1 TO 6 AND COMPARATIVE EXAMPLES A TO C

An aluminum web (0.3 mm in thickness and 1,000 mm in width) was continuously conveyed through 10% aqueous solution of trisodium phosphate maintained at 80° C. for one minute to degrease the same. Then, the surface of the aluminum plate was grained with a nylon brush and an aqueous suspension of 400 mesh pumice and washed with water sufficiently. The aluminum plate thus treated was immersed in 25% sodium hydroxide aqueous solution maintained at 45° C. for 9 seconds to carry out the etching of the surface thereof, washed with water, then further immersed in 20% nitric acid for 20 seconds and washed with water. At this stage, the etched amount of the grained surface was about 8 g/m$^2$. Thereafter, the aluminum plate was anodized in 7% sulfuric acid as the electrolyte under a current density of 15 A/dm$^2$ to form 3 g/m$^2$ of direct current anodized film on the surface of the plate and the aluminum plate thus treated was subjected to coating operation after washing and drying.

In the coating operation, a coating liquid having the following composition was used:

| Light-Sensitive Liquid (Composition) | |
|---|---|
| Ester compound of naphthoquinone-1,2-diazido-5-sulfonyl chloride and pyrogallol-acetone resin (*1) | 0.80 g |
| Cresol-formaldehyde resin | 2.00 g |
| tert-Butylphenol-formaldehyde resin (*2) | 0.05 g |
| Anhydrous tetrahydrophthalic acid | 0.15 g |
| Naphthoquinone-1,2-diazido-4-sulfonyl chloride | 0.03 g |
| Oil Blue #603 (ORIENT CHEMICALS IND. INC.) | 0.05 g |
| Fluorine-containing surfactant (*3) | 0.01 g |
| Mixed solvent (see Table I) | 34 g |

(*1): This compound is disclosed in U.S. Pat. No. 3,635,709 (Example 1).
(*2): This resin is disclosed in U.S. Pat. No. 4,123,279.
(*3): This is a copolymer of N—butylperfluorooctane sulfonamide ethylacrylate ($C_8F_{17}SO_2N(C_4H_9)CH_2CH_2OCOCH=CH_2$: 50%) and poly(oxyalkylene)acrylate[$CH_3O(C_2H_4O)_7CO-CH=CH_2$: 50%]; molecular weight (M.W.) = 20,000

The aforementioned coating liquid was continuously coated on the surface of the grained aluminum web in an amount of 30 g/m$^2$, then dried by passing it to a drying zone, to which hot air of 100° C. was supplied, for 45 seconds or one minute to form a light-sensitive layer.

The resultant light-sensitive layer were examined on various properties. The results thus obtained are listed in the following Table I.

TABLE I

| | Boiling Point (B.P.; °C.) | Example | | | | | | Comparative Example | | |
|---|---|---|---|---|---|---|---|---|---|---|
| | | 1 | 2 | 3 | 4 | 5 | 6 | a | b | c |
| Methyl ethyl ketone | 79.6 | 35% | 35% | 35% | 35% | 35% | 35% | 35% | 35% | 35% |
| Propylene glycol | 120 | 64% | 62% | 60% | 55% | 55% | 45% | 65% | — | — |

TABLE I-continued

| | Boiling Point (B.P.; °C.) | Example 1 | 2 | 3 | 4 | 5 | 6 | Comparative Example a | b | c |
|---|---|---|---|---|---|---|---|---|---|---|
| monomethyl ether | | | | | | | | | | |
| Diethylene glycol dimethyl ether | 162 | 1% | 3% | 5% | 10% | — | — | — | — | — |
| Ethylene glycol monomethyl ether acetate | 145.1 | — | — | — | — | 10% | 20% | — | 65% | 65% |
| Drying time (second) | | 45 | 45 | 45 | 45 | 45 | 45 | 45 | 45 | 60 |
| Amount of residual solvent (mg/m²) | | | | | | | | | | |
| Methyl ethyl ketone | | — | — | — | — | — | — | — | — | — |
| Propylene glycol monomethyl ether | | 164 | 86 | 37 | 17 | 88 | 47 | 273 | — | — |
| Diethylene glycol dimethyl ether | | 28 | 71 | 88 | 93 | — | — | — | — | — |
| Ethylene glycol monomethyl ether acetate | | — | — | — | — | 90 | 115 | — | 184 | 152 |
| Development latitude (steps) | | 2.5 | 2.0 | 1.7 | 1.7 | 2.7 | 2.5 | 3.5 | 3.0 | 2.5 |
| Developing capability | | D | C | B | B | D | B | F | B | B |
| Strength of light-sensitive film | | D | B | B | A | D | B | F | F | D |
| Ink receptivity | | D | C | B | B | B | B | F | E | B |

In Table I, the amount of residual solvent was determined by subjecting a specimen of the light-sensitive layer having a constant area to gas chromatographic analysis.

The development latitude herein means "a change in solid steps", which is determined by printing the gray scale (Fuji Photo Film Co. Ltd.) having 0.15 density difference on the light-sensitive layer, developing it with a developer DP-4(⅛ diluted) (Fuji Photo Film Co. Ltd.) at 25° C. according to tray development to determine the change in solid steps observed between 30 seconds and 5 minutes after commencing the development. The smaller the change in solid steps, the greater the development latitude.

The development capability herein means the number of the resultant lithographic printing plates having practically acceptable properties, obtained after continuously treating the light-sensitive layer in the same developer. This is determined by successively treating the resulting light-sensitive layer on the web support with a developer DP-4 (⅛ diluted) at 25° C. for 40 seconds at a rate of 0.5 m²/hour using an automatic developing machine 800 U (manufactured and sold by Fuji Photo Film Co. Ltd.), until the development of the light-sensitive layer becomes defective. The development capability is evaluated by the number of the lithographic printing plates thus obtained. The light-sensitive layer having a good development capability can provide a great number of printing plates practically acceptable.

The strength of the light-sensitive film was determined by writing a mark on the unexposed portion thereof in a ball point pen, treating it with DP-4 (⅛ diluted) at 25° C. for 40 seconds and observing the status of the treated light-sensitive film. The light-sensitive layers having a high film strength were not influenced by the mark written in a ball point pen, while these having a low film strength were removed by development.

The ink receptivity was determined by exposing the light-sensitive layer to light and developing it, coating a gum GP (manufactured and sold by Fuji Photo Film Co. Ltd.) thereon and allowing to stand for one week, then carrying out printing and observing the condition of the layer till it becomes completely ink receptive.

In these tests, the results of the developing capability, the strength of the light-sensitive film and the ink receptivity are classified into six grades of from A (extremely good) to F (bad). The light-sensitive layers classified into A to D are acceptable and can be put into practical use, on the contrary those classified into E and F cannot practically be acceptable.

The product of Comparative Example c corresponds to a light-sensitive layer of the conventional technique. The product of Comparative Example b corresponds to that of Comparative Example in which the layer is dried for a period of time shorter than that in the latter. The results of the product in Comparative Example b show that it has low development capability, strength of the light-sensitive film and ink receptivity.

In contrast to this result, the results observed in Comparative Example in which propylene glycol monomethyl ether is used as the solvent show that the amount of residual solvent increases and that all the development latitude, development capability, strength of the light-sensitive film and ink receptivity are very bad, though the boiling point of the solvent used is low.

On the other hand, these properties were enhanced in the light-sensitive layer obtained from the composition according to the present invention in which a proper amount of diethylene glycol dimethyl ether and ethylene glycol monomethyl ether acetate are added, compared with those of the products in Comparative Examples and b, inspite of the drying time being shortened. Moreover, it was found that the overall amount of residual solvents is also reduced, unexpectedly, inspite of using high boiling point solvents. It is believed that the improvement in properties due to the addition of high boiling point solvents stems from the fact that the amount of residual solvents is reduced due to the proper change in the solvent composition during drying and thus a light-sensitive layer having uniorm film properties can be obtained.

EXAMPLE 7

The procedures of Examples 1 to 6 were repeated to form a light-sensitive layer except that a mixed solvent having the following composition was used. The resulting light-sensitive layer had an improved development latitude compared with that in Comparative Example a.

| | |
|---|---|
| Methyl ethyl ketone | 35% |
| Propylene glycol monomethyl ether | 64.5% |
| γ-Butyrolactone (B.P. = 203-204° C.) | 0.5% |

EXAMPLES 8 AND 9

Light-sensitive layers were prepared according to Examples 1 to 6 except that a mixed solvent of the following composition was used. The resulting product (Example 8) was improved in the development capability and strength of the resultant film and that in Example 9 was improved in the development capability, strength of the film and ink receptivity when compared with the product in Comparative Example a.

| | Example 8 | Example 9 |
|---|---|---|
| Methyl ethyl ketone | 35% | 35% |
| Propylene glycol monomethyl ether | 60% | 55% |
| Cyclohexanone (B.P. = 155.7° C.) | 5% | 10% |

EXAMPLE 10

The procedures of Example 3 were repeated except that a fluorine-containing surfactant having a molecular weight of 50,000 was used and that a mixed solvent of the following composition was used. The resultant light-sensitive layer had good properties similar to those of the product in Example 3.

| | |
|---|---|
| Methyl ethyl ketone | 60% |
| Propylene glycol monomethyl ether | 35% |
| Diethylene glycol dimethyl ether | 5% |

EXAMPLES 11 TO 13

Light-sensitive layers were prepared according to the procedures of Examples 1 to 6 except that mixed solvents having the compositions listed in the following Table II and good results were observed.

TABLE II

| Solvent | B.P. (°C.) | Example 11 | Example 12 | Example 13 |
|---|---|---|---|---|
| Methyl ethyl ketone | 79.6 | 20% | 20% | — |
| Ethylene dichloride | 83.5 | 20% | 20% | 40% |
| Methyl isobutyl ketone | 115.9 | 20% | — | — |
| Ethylene glycol monomethyl ether | 124.4 | — | 55% | — |
| Propylene glycol monoethyl ether | 132.2 | 35% | — | 55% |
| Diethylene glycol dimethyl ether | 162 | 5% | 5% | 5% |

EXAMPLES 14 TO 20 AND COMPARATIVE EXAMPLES D TO G

An aluminum web treated according to the procedures as disclosed in Examples 1 to 6 was subjected to the following coating operation using the following composition.

| Composition of Light-Sensitive Liquid (Composition) | |
|---|---|
| Ester compound of naphthoquinone-1,2-diazido-5-sulfonyl chloride and pyrogallol-acetone resin (*4) | 0.80 g |
| Cresol-formaldehyde resin | 2.00 g |
| tert-Butylphenol-formaldehyde resin (*5) | 0.05 g |
| Anhydrous tetrahydrophthalic acid | 0.15 g |
| Naphthoquinone-1,2-diazido-4-sulfonyl chloride | 0.03 g |
| Oil Blue #603 (ORIENT CHEMICALS IND. INC.) | 0.05 g |
| Fluorine-containing surfactant (*6) | 0.01 g |
| Mixed solvent (see Table III) | 34 g |

(*4): This compound is disclosed in U.S. Pat. No. 3,635,709 (Example 1).
(*5): The resin is disclosed in U.S. Pat. No. 4,123,279.
(*6): This is a copolymer of N—butylperfluorooctane sulfonamide ethylacrylate [$C_8F_{17}SO_2N(C_4H_9)CH_2CH_2OCOCH=CH_2$; 50%] and poly(oxyalkylene)-acrylate $CH_3O(C_2H_4O)_7COCH=CH_2$; 50% having a molecular weight of 20,000.

The coating liquid was continuously coated on the surface of the grained aluminum web according to the procedures similar to those in Examples 1 to 6 to form light-sensitive layers. On the resultant light-sensitive layers, a various properties were measured and the results obtained were summarized in the following Table III.

TABLE III

| Components of Organic Solvent | Boiling Point (°C.) | Example 14 | Example 15 | Example 16 | Example 17 | Example 18 | Example 19 | Example 20 | Comparative Example d | Comparative Example e | Comparative Example f | Comparative Example g |
|---|---|---|---|---|---|---|---|---|---|---|---|---|
| Methyl ethyl ketone [group (a)] | 79.6 | 35% | 35% | 35% | 35% | 35% | 35% | 35% | 35% | 35% | 35% | 35% |
| Propylene glycol monomethyl ether [group (b)] | 120 | 64.5% | 63% | 54.5% | 59.5% | 64% | 54% | 59% | 60% | 65% | | |
| Ethylene glycol monomethyl ether acetate [group (d)] | 145.1 | — | — | 10% | — | — | 10% | — | — | — | 65% | 65% |
| Diethylene glycol dimethyl ether [group (d)] | 162 | — | — | — | 5% | — | — | 5% | — | — | — | — |
| Diethylene glycol monoethyl ether acetate [group (c)] | 217.4 | 0.5% | 2% | 0.5% | 0.5% | — | — | — | 5% | — | — | — |
| Triethylene glycol dimethyl | 216 | — | — | — | — | 1% | 1% | 1% | — | — | — | — |

TABLE III-continued

| Components of Organic Solvent | Boiling Point (°C.) | Example 14 | 15 | 16 | 17 | 18 | 19 | 20 | Comparative Example d | e | f | g |
|---|---|---|---|---|---|---|---|---|---|---|---|---|
| ether [group (c)] | | | | | | | | | | | | |
| Drying Time (second) | | 45 | 45 | 45 | 45 | 45 | 45 | 45 | 45 | 45 | 45 | 60 |
| Development Latitude (solid step) | [time] | 2.5 | 2.7 | 2.3 | 1.7 | 2.7 | 2.5 | 1.7 | 3.5 | 3.5 | 3.0 | 2.5 |
| | [concentration] | 4.0 | 4.3 | 3.7 | 3.3 | 4.0 | 3.7 | 3.3 | 6.0 | 6.0 | 5.0 | 3.5 |

In Table III, the development latitude was expressed as the change in solid steps (time) determined by printing the gray scale [Fuji Photo Film Co. Ltd.] having a 0.15 density difference on the light-sensitive layer, developing it with a developer DP-4 (⅛ diluted) at 25° C. according to tray development and observing the change in the solid steps between 30 seconds and 5 minutes after commencing the development; and as the change in solid steps (concentration) determined by observing the change in density between development in DP-4 (⅛ diluted) and (1/6 diluted) carried out at 25° for one minute. The smaller the change in solid steps, the greater the development latitude of the light-sensitive layer.

The product of Comparative Example g corresponds to the conventional light-sensitive layer. The produce of Comparative Example f corresponds to that of Comparative Example g in which the product is dried for a period of time shorter than that in the latter. The results on the product obtained in Comparative Example f clearly show that the development latitude is extremely lowered. While, the product of Comparative Example e has a low development latitude although a solvent having a low boiling point is used. On the other hand, it was found that the development latitude is improved in the products of Examples 14 to 20 compared with those of Comparative Examples e and f inspite of the shortened drying time. While, the product in Comparative Example d has an insufficient development latitude, this is because in Comparative Example d, a solvent containing a large amount of high boiling point solvents [group (c)]is used. The compositions in Examples 14 to 20 provided lithographic printing plates having excellent performances.

EXAMPLES 21 TO 23

Three light-sensitive layers were prepared according to the procedures as disclosed in Examples 15 to 17, except that a fluorine-containing surfactant having a molecular weight of 50,000 and that mixed solvents having compositions shown in the following Table IV respectively and results similar to those obtained in Examples 15 to 17 were observed.

TABLE IV

| Components of Organic Solvent | Boiling Point (B.P.; °C.) | Example 21 | 22 | 23 |
|---|---|---|---|---|
| Methyl ethyl ketone [group (a)] | 79.6 | 60% | 60% | 60% |
| Propylene glycol monomehtyl ether [group (b)] | 120 | 38% | 29.5% | 34.5% |
| Ethylene glycol monomethyl ether acetate [group (d)] | 145.1 | — | 10% | — |
| Diethylene glycol dimethyl ether [group (d)] | 162 | — | — | 5% |
| Diethylene glycol monoethyl ether acetate [group (c)] | 217.4 | 2% | 0.5% | 0.5% |
| Drying Time (second) | | 45 | 45 | 45 |
| Development Latitude (solid step) [time] | | 2.5 | 2.3 | 1.8 |
| [concentration] | | 4.1 | 3.6 | 3.4 |

EXAMPLE 24 AND 25

According to the procedures described in Examples 14 to 20 except that mixed solvents having compositions shown in the following Table V, two light-sensitive layers were formed It was observed that the development latitude is improved in these two layers compared with that obtained in Comparative Example d.

TABLE V

| Components of Organic Solvent | Boiling Point (B.P.; °C.) | Example 24 | 25 |
|---|---|---|---|
| Methyl ethyl ketone [group (a)] | 79.6 | 35% | 35% |
| Propylene glycol monomethyl ether [group (b)] | 120 | 64.5 | 63% |
| Diethylene glycol monobutyl ether acetate [group (c)] | 246.8 | 0.5% | |
| Diethylene glycol dibutyl ether [group (c)] | 254.6 | — | 0.5% |
| Drying Time (second) | | 45 | 45 |
| Development Latitude (solid step) [time] | | 2.8 | 3.0 |
| [concentration] | | 4.2 | 4.2 |

EXAMPLES 26 TO 28

Light-sensitive layers were formed according to the procedures similar to those in Example 14 to 20 except that there was used mixed solvents of the following compositions shown in Table VI comprised of the groups (a), (b) and (c). Good results were obtained.

TABLE VI

| Components of Organic Solvent | Boiling Point (B.P.; °C.) | Example 26 | 27 | 28 |
|---|---|---|---|---|
| Methyl ethyl ketone [group (a)] | 79.6 | 20% | 20% | — |
| Ethylene dichloride [group (a)] | 83.5 | 20% | 20% | 40% |
| Methyl isobutyl ketone [group (b)] | 115.9 | 20% | — | — |
| Ethylene glycol monomethyl ether [group (b)] | 124.4 | — | 59% | — |
| Propylene glycol monoethyl ether [group (c)] | 132.2 | 39% | — | 59% |
| Diethylene glycol monoethyl ether acetate [group (c)] | 217.4 | 1% | 1% | 1% |
| Drying Time (second) | | 45 | 45 | 45 |
| Development Latitude (solid steps) [time] | | 2.5 | 2.9 | 2.7 |
| [concentration] | | 3.8 | 4.0 | 4.1 |

What is claimed is:

1. A positive working presensitized plate comprising an aluminum support having a positive working light-sensitive composition thereon, said light-sensitive composition comprising an o-quinone-diazide compound having an increased solubility in an alkaline solution upon exposure to actinic light and a phenol resin in admixture with a mixed solvent comprising (i) methyl ethyl ketone, (ii) propylene glycol monomethyl ether, and (iii) diethylene glycol dimethyl ether and wherein said aluminum support is coated with the light-sensitive composition and the coating is dried to form the plate.

2. The positive-working presensitized plate as set forth in claim 1 wherein the mixed organic solvent consists of 20 to 70% by weight of the organic solvent (i), 10 to 79% by weight of the organic solvent (ii) and 0.1 to 30% by weight of the organic solvent (iii).

3. The positive working presensitized plate as set forth in claim 2, wherein the total content of said o-quinone-diazide compound and said phenol resin ranges from about 2 to about 50% by weight based on the total weight of the composition.

4. The positive working presensitized plate as set forth in claim 2, wherein said o-quinone-diazide compound is an ester of naaphthoquinone-(1,2)-diazido sulfonyl chloride and a pyrogallol-acetone resin or an ester of naphthoquinone-(1,2)-diazido sulfonyl chloride and a phenol-formaldehyde resin.

5. The positive working presensitized plate as set forth in claim 2, wherein said phenol resin is a novolak resin.

6. The positive working presensitized plate as set forth in claim 5, wherein said novolak resin is at least one member of the group of phenol-formaldehyde resins, cresol-formaldehyde resins, phenol-cresol-formaldehyde resins, p-tert-butyl-phenol-formaldehyde resins, and phenol-modified xylene resins.

7. The positive working presensitized plate as set forth in claim 5, wherein an amount of said o-quinone-diazide compound and said novolak resin ranges from about 10 to about 50% and about 45 to about 79%, by weight based on the total weight of the o-quinone-diazide compound and the novolak resin, respectively.

8. The positive working presensitized plate set forth in claim 2, wherein said composition further comprises a fluorine-containing surfactant.

9. The positive working presensitized plate set forth in claim 8, wherein said fluorine-containing surfactant is a copolymer of (a) an acrylate or a methacrylate having a fluoroaliphatic group (Rf) having 3 to 20 carbon atoms, at least 40% by weight of fluorine atoms and at least three terminal carbon atoms which are fully fluorinated, and (b) a poly(oxyalkylene)acrylate or poly(oxyalkylene)methacrylate, wherein the Rf group containing acrylate or Rf group containing methacrylate monomer unit is included in the copolymer in an amount ranging from about 10 to about 70% by weight based on the weight of the copolymer.

10. The positive working presensitized plate set forth in claim 8, wherein said fluorine-containing surfactant is incorporated in an amount ranging from about 0.01 to about 5% by weight based on the total weight of the composition except for the mixed solvent.

11. A positive working presensitized plate comprising an aluminum support having a positive working light-sensitive composition thereon, said light-sensitive composition comprising an o-quinone-diazide compound having an increased solubility in an alkaline solution upon exposure to actinic light and a phenol resin in admixture with a mixed solvent consisting essentially of (i) methyl ethyl ketone, (ii) propylene glycol monomethyl ether, and (iii) diethylene glycol dimethyl ether and wherein said aluminum support is coated with the light-sensitive composition and the coating is dried to form the plate.

* * * * *